United States Patent
Shintani et al.

(10) Patent No.: US 6,651,678 B2
(45) Date of Patent: Nov. 25, 2003

(54) METHOD OF MANUFACTURING SEMICONDUCTOR DEVICE

(75) Inventors: Kenji Shintani, Tokyo (JP); Mutumi Tuda, Tokyo (JP); Junji Tanimura, Tokyo (JP); Takahiro Maruyama, Tokyo (JP); Ryoichi Yoshifuku, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/124,729

(22) Filed: Apr. 18, 2002

(65) Prior Publication Data

US 2003/0096505 A1 May 22, 2003

(30) Foreign Application Priority Data

Nov. 16, 2001 (JP) .......................... 2001-351652

(51) Int. Cl.[7] ............................. H01L 21/302
(52) U.S. Cl. ................... 134/1.2; 438/725; 438/714; 438/719; 438/720; 438/734; 438/740; 438/742; 438/743; 438/723
(58) Field of Search ................ 438/725, 714, 438/719, 720, 734, 740, 742, 743, 723; 134/1.2

(56) References Cited

U.S. PATENT DOCUMENTS 6,037,266 A * 3/2000 Tao et al. .................... 438/712
6,387,820 B1 * 5/2002 Sanderfer .................... 438/725
6,559,062 B1 * 5/2003 Downey et al. ............. 438/734
2002/0151183 A1 * 10/2002 Yang et a. ................... 438/714

FOREIGN PATENT DOCUMENTS

JP        06-232091     *  8/1994

OTHER PUBLICATIONS

L. Desvoivres et al.; "Sub–0.1 $\mu$m gate etch processes: Towards some limitations of the plasma technology?", *J. Vac. Sci. Technol.*, B 18(1), pp. 156–165, (Jan./Feb. 2000).

L. Desvoivres et al.; "X–ray photoelectron spectroscopy investigation of sidewall passivation films formed during gate etch processes", *J. Vac. Sci. Technol.*, B 19(2), pp. 420–426, (Mar./Apr. 2001).

* cited by examiner

Primary Examiner—George Guodreau
(74) Attorney, Agent, or Firm—Leydig, Voit & Mayer, LTD

(57) ABSTRACT

A method of etching a semiconductor device preventing tapering of a gate electrode edge includes a main etching of an electrode or wiring material supported by a dielectric film at a semiconductor substrate surface to expose the dielectric film. After the main etching step, residues of the electrode or the wiring material by sequentially etching utilizing a first gas mixture including a halogen-containing gas and an additive gas suppressing etching of the dielectric film by the halogen-containing gas, and in a second gas mixture gas including the halogen-containing gas and the additive gas and having the additive gas amount in a larger concentration than the first gas mixture.

8 Claims, 15 Drawing Sheets

METHOD OF MANUFACTURING SEMICONDUCTOR DEVICE

BACKGROUND OF THE INVENTION

1. Field of the Invention

This invention relates generally to a method for manufacturing a semiconductor device and more particularly to a method of etching an electrode or wiring material as formed on or above an ultra-thin gate dielectric film.

2. Description of the Related Art

The transistors used in logic circuits and/or system LSIs are required to offer ever higher performance. Therefore, the thickness of the gate dielectric films are currently designed to be not more than 3 nm, and there is development work to make the film thinner, not more than 2 nm. In addition, the length of a gate electrode has been developed to scale down to not more than 0.1 $\mu$m (100 nm)

An etching process using a method for manufacturing such minute gate electrodes is required to achieve a high accuracy of finished dimension with respect to gate electrodes while at the same time controlling damage to the thin gate dielectric film. In responding to such demands, several proposals have been made as to high-selectivity etching methods for etching gate electrode material while preventing etching of a gate dielectric film associated therewith.

FIG. 11 is a flow diagram showing conventional method of manufacturing a semiconductor device, which has been disclosed in *J. Vac. Sci. Technol.*, B18 (1), 156, wherein S1 designates processing start-up, S2 denotes a main etching process step (etching of a gate electrode), S3 indicates termination point detection (detection of a residual film thickness of 30 nm of amorphous Si), S4 shows an overetching process step, and S5 is processing completion, respectively. Disclosed here is a semiconductor device manufacturing method which combines, with respect to amorphous Si gate electrode etching, the main etching of a gate electrode using a gas containing therein chlorine ($Cl_2$), hydrogen bromide (HBr) and oxygen($O_2$) and the overetching of a gate dielectric film using a gas containing HBr and $O_2$ for permitting etching of gate electrode material while preventing etching of the gate dielectric film to thereby realize high selectivity etching.

The method of manufacturing the semiconductor device employs etching apparatus such as a helicon plasma RIE apparatus or the like for etching with respect to a semiconductor substrate 1 which comprises a gate dielectric film 2 with a thickness of 1.8 nm, an amorphous Si film 3 with a thickness of 150 nm and a mask 4 that is formed of a 50-nm thick TEOS oxide film as shown in FIG. 12, thereby making a gate electrode 31 as shown in FIG. 13.

In such semiconductor device manufacturing method, the etching of gate electrode 3' (main etching) is performed by introducing the mixture gas containing chlorine ($Cl_2$), hydrogen bromide (HBr) and oxygen ($O_2$) into the above-noted helicon plasma RIE apparatus for production of a reactive plasma under the condition that RF bias power is set at 150W to thereby etch a portion or portions of the amorphous Si 3 at which the mask 4 is not formed. Additionally at this time, an ellipsometry film thickness monitor as installed within a chamber is used to monitor a residual film thickness of the amorphous Si 3; when the residual film thickness of amorphous Si 3 becomes 30 nm through progression of etching, changeover is done to specific etching condition of high selectivity (etching rate ratio of gate electrode layer/gate dielectric film layer is$\leq$100) which prevents the gate dielectric film 2 from being cut away (referred to as overetching process hereinafter). At the overetching process step, any amorphous Si presently residing on the gate dielectric film is subjected to etching for a predetermined length of time period under the condition that RF bias power of helicon plasma RIE apparatus is at 60W while using a mixture gas ($O_2$ addition amount$\approx$14%) of HBr (50 sccm) and $O_2$ (8 sccm).

FIG. 13 is a cross-sectional view of the gate electrode 3' after completion of etching up to the termination point judgment (a time point for detection of a residual film thickness of 30 nm of amorphous Si 3) by use of the semiconductor device manufacturing method concerned, wherein numeral 5 indicates amorphous silicon with a thickness of 30 nm as left after execution of the main etching. In addition, FIG. 14 is a sectional view of gate electrode 3' after having performed etching processing up to the overetching by using the semiconductor device manufacturing method, wherein 6 denotes deposition matter being attached to gate electrode sidewalls, such as $SiBr_xO_y$.

The conventional gate electrode is etched by the method described above and has a tapered sectional shape such as shown in FIG. 13. Because stable control of the taper angles of this shape is difficult, the gate electrode varies from the design size. The deviation in gate size has been a problem in semiconductor device manufacturing and fabrication methods. Additionally for the future, in the manufacture of certain devices with gate length Lg<0.1 $\mu$m, it is readily presumed that this gate size deviation can reduce device production yields. Further, in the case of forming a gate electrode on an ultrathin gate dielectric film ($T_{ox}$<3 nm), there is also a problem that setting of a relatively stronger overetching condition for suppression of the $O_2$ addition amount of overetching—that is, low in selectivity—when attempting to obtain an anisotropic etching shape would result in the gate dielectric film also being etched, which leads to occurrence of "go-through" portions 7 in the gate oxide film such as shown in FIG. 15.

Accordingly, it is an object of the present invention to provide a semiconductor device manufacturing method producing an anisotropic etching shape during etching of a Si-contained electrode and/or wiring lead material on or above a dielectric film and further capable of etching of electrodes and/or wiring leads without associated creation of go-through portions of the dielectric film even in cases where an underlying dielectric film is an ultrathin film.

SUMMARY OF THE INVENTION

A method of manufacturing a semiconductor device according to the present invention includes a main etching step of applying etching treatment to an electrode or wiring material being formed on or above a dielectric film as provided at a semiconductor substrate surface to thereby expose the dielectric film, a first overetching step of etching away, after the main etching step, etching residues of the electrode or the wiring material having failed to be etched during etching treatment of the main etching step by etching utilizing a first mixture gas comprising a halogen gas and an additive gas having an effect for suppression of etching of the dielectric film by the halogen gas, and a second overetching step of etching away, after the first overetching step, the etching residues by etching utilizing a second mixture gas comprising the halogen gas and the additive gas and having the additive gas amount of a ratio greater than the first mixture gas.

Further, according to the present invention, an additive gas is a gas selected from the group consisting of $O_2$, $N_2$, and a combination thereof.

Still further, according to the present invention, an additive gas in the first mixture gas is $O_2$ with its addition amount of 5% or less.

Additionally, according to the present invention, a halogen gas is a gas selected from the group consisting of HBr, $Cl_2$, HCl, HI and combinations thereof.

Additionally, according to the present invention, an electrode or wiring material contains Si.

Additionally, according to the present invention, an etching treatment at the main etching step utilizes a gas of $HBr/O_2/Cl$ based gas as a third mixture gas.

Additionally, according to the present invention, a time period of the overetching at the first overetching step is less than or equal to ⅓ of a time of overetching at the second overetching step.

Still additionally, according to the present invention, a semiconductor substrate is held at temperatures lower than or equal to 0° C. at steps of the main etching step, the first overetching step and the second overetching step, respectively.

DESCRIPTION OF THE PREFERRED EMBODIMENTS

The invention is described in more detail with reference to the attached drawings enclosed herewith, which, however, are not intended to restrict the scope of the invention.

Embodiment 1

Figure 1:
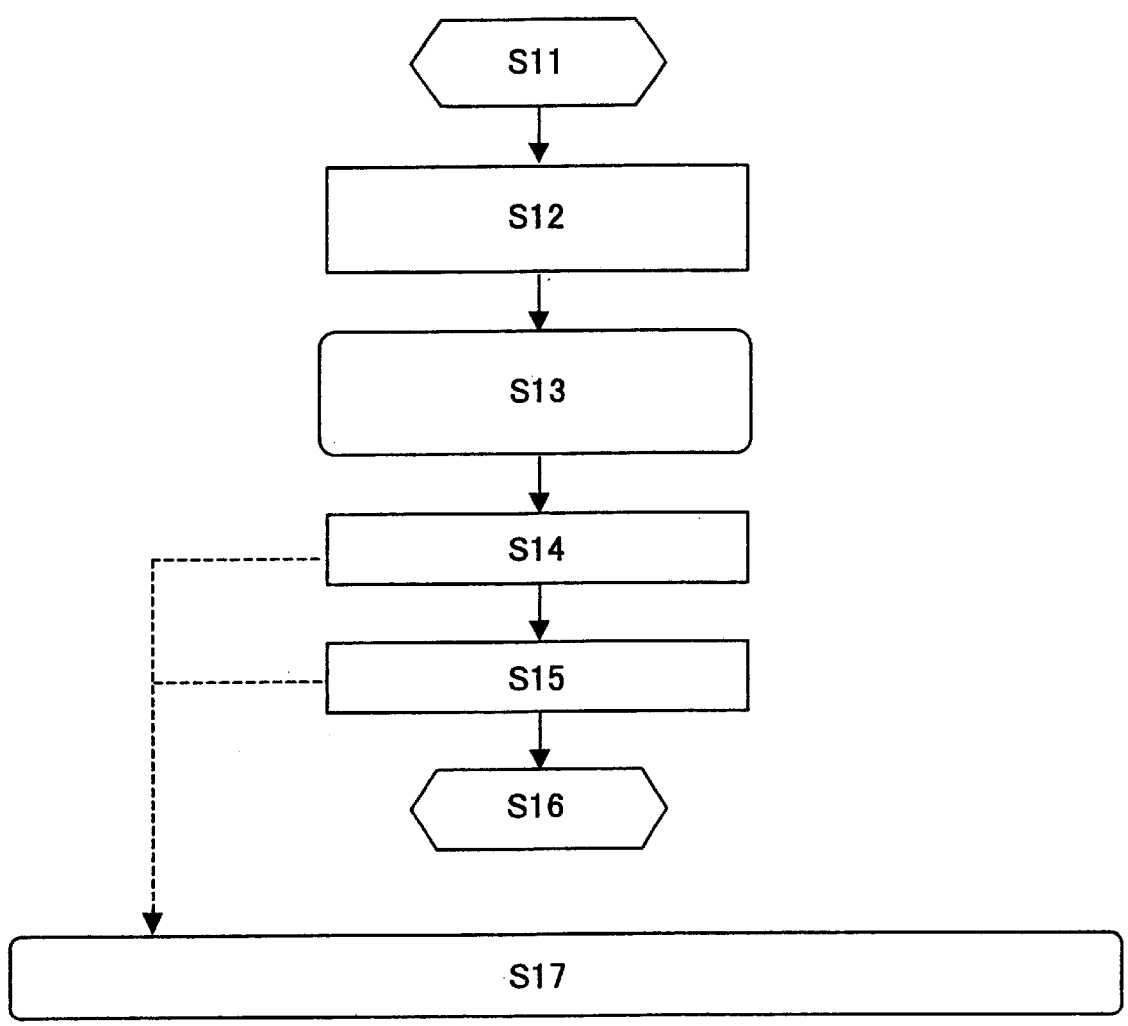
FIG. 1 is a flow diagram showing the semiconductor device manufacturing method of the present invention.
Figure 2:
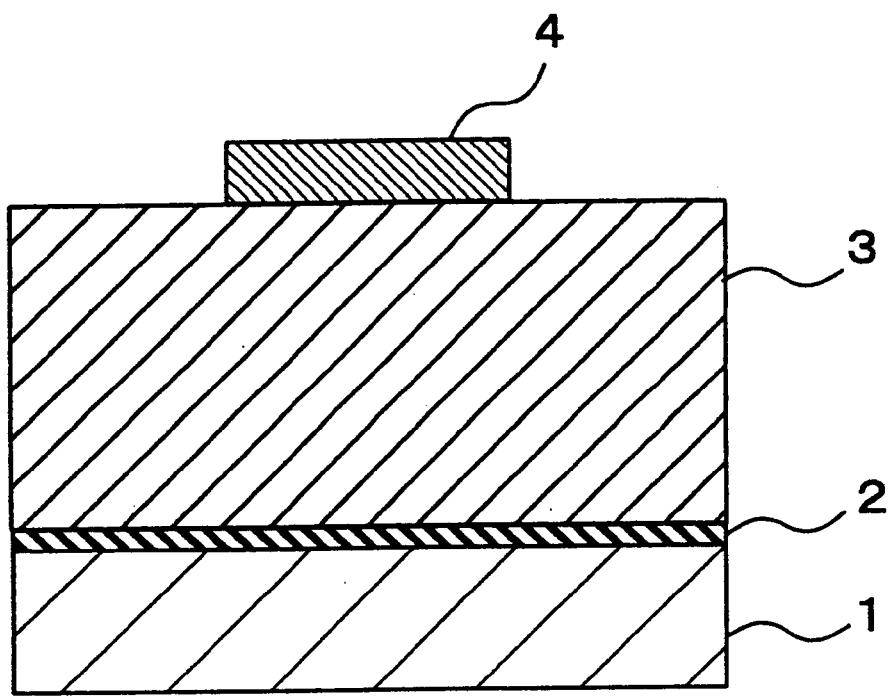
FIG. 2 is a cross-sectional view showing the structure prior to gate etching of a semiconductor device for use with the semiconductor device manufacturing method of the present invention.
Figure 3:
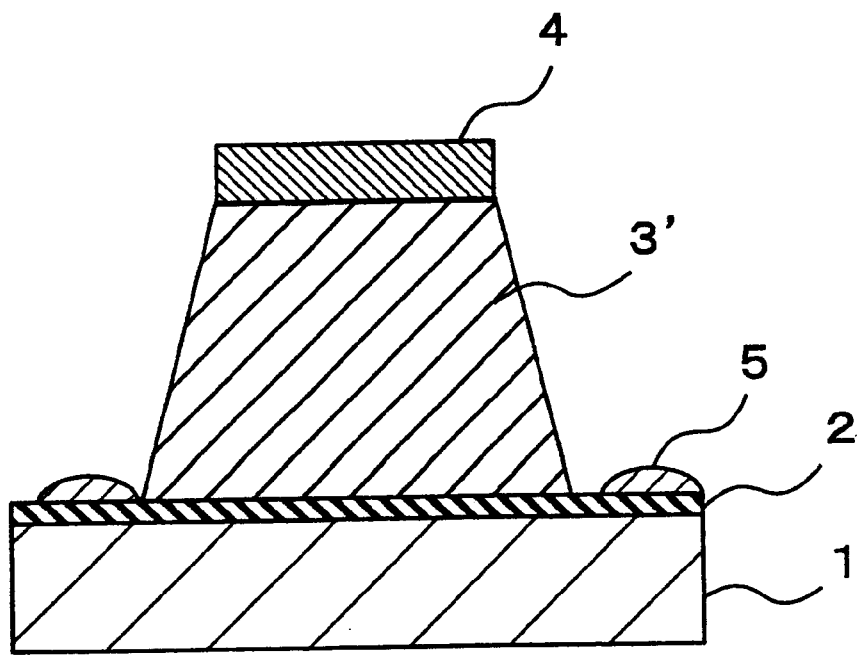
FIG. 3 is a cross-sectional view showing the structure after main etching of the semiconductor device for use with the semiconductor device manufacturing method of the present invention.
Figure 4:
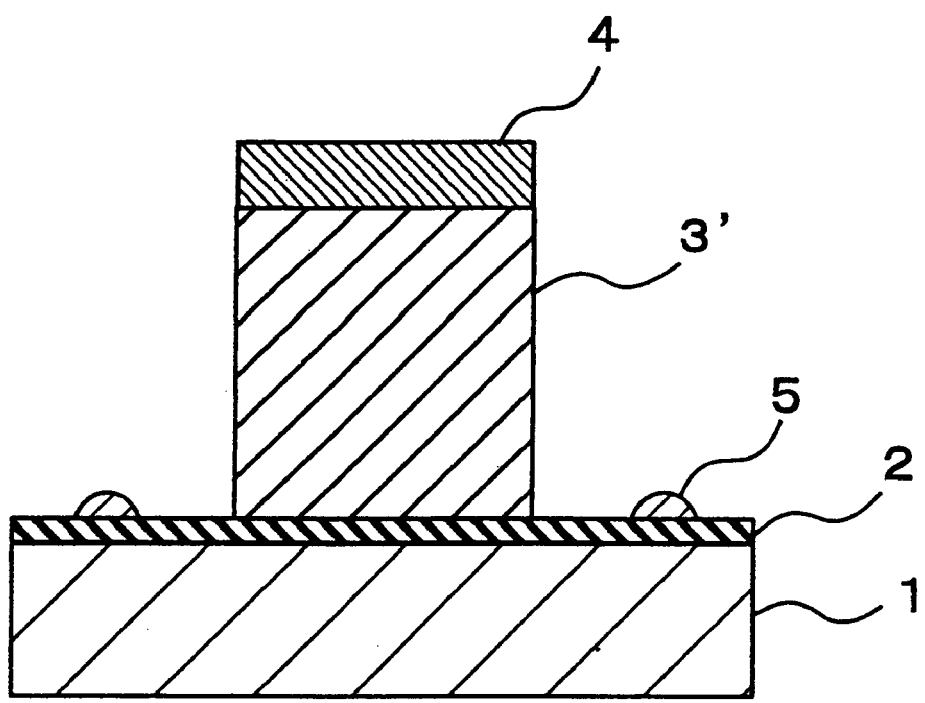
FIG. 4 is a cross-sectional view showing the structure after first overetching of the semiconductor device for use with the semiconductor device manufacturing method of the present invention.
Figure 5:
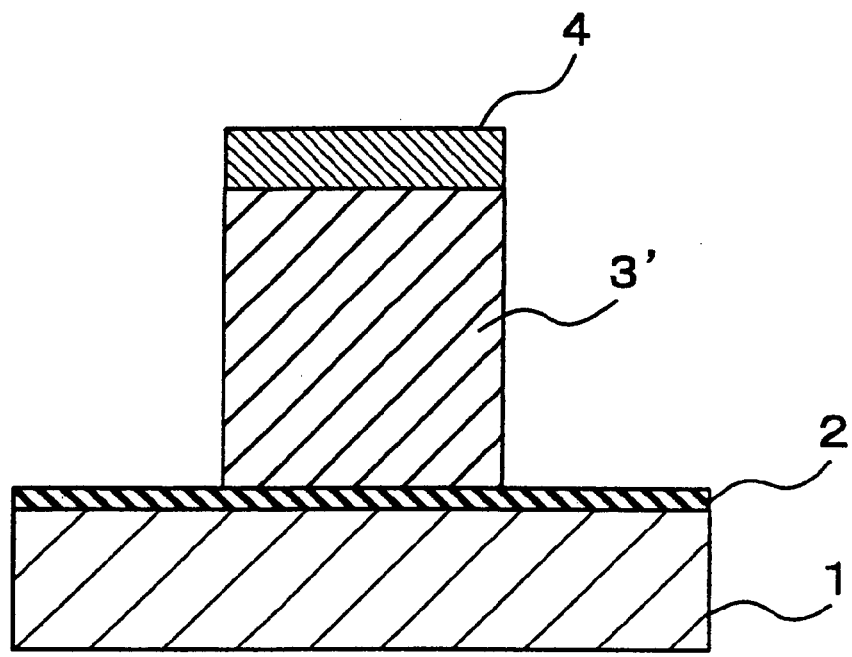
FIG. 5 is a cross-sectional view showing the structure after second overetching of the semiconductor device for use with the semiconductor device manufacturing method of the present invention.

FIG. 1 is a flow diagram showing a manufacturing method of a semiconductor device of the present invention, wherein S11 designates processing startup, S12 denotes a main etching process step (gate electrode etching), S13 indicates termination point detection (detection of exposure of a gate oxide film), S14 shows a first overetching step, S15 is a second overetching step, S16 is end of processing, and S17 is judgment standard of changeover from the first overetching step to the second overetching step ($O_2$ addition amount at the first overetching step<$O_2$ addition amount at the second overetching step), respectively. In addition, FIGS. 2 through 5 are cross-sectional views showing the structures of a semiconductor device at respective steps in the case of implementation of the semiconductor device manufacturing method of the present invention. The semiconductor device being used for such manufacturing method is the one that includes a semiconductor substrate 1 (Si wafer) as provided with a gate dielectric film 2 ($SiO_2$) and a gate electrode 3 (Poly-Si) plus a mask 4 (TEOS oxide film) on or above the substrate (FIG. 2). The manufacturing method will now be set forth in accordance with the flow indicated in FIG. 1. In FIGS. 3–4, 3' is used to designate a gate electrode that was formed by etching. In FIGS. 3–5, 5 denotes residues of gate electrode material, which have failed to be etched away. In the manufacturing method of such semiconductor device, for example, it starts with a main etching step which performs etching with respect to more than one gate electrode and wiring lead material made of Poly-Si or the like within an atmosphere of a mixture of gaseous $Cl_2$, HBr and $O_2$ (FIG. 3). At this time, whether exposure of a gate dielectric film that is an underlayer or "undercoat" material is present or absent is to be constantly monitored by, for example, plasma luminance and/or ellipsometry. And, upon confirmation of exposure of part of the gate dielectric film that is the undercoat material, let the atmospheric gas be exchanged with an $HBr/O_2$ based gas as an example; then, rearrange the etching shape of a gate electrode while at the same time suppressing adhesion of certain material (to be called the deposition matter hereinafter) being produced due to deposition onto gate electrode sidewalls by a first overetching process that is a relatively strong overetching condition of less $O_2$ addition amount (FIG. 4). After elapse of a predetermined length of time from the startup of the first overetching process, changeover or switching is done to an atmospheric gas having its $O_2$ addition amount greater than the $O_2$ addition amount at the first overetching step and then etch any residues of Poly-Si being left on the gate dielectric film by a second overetching process which is a relatively weak etching condition. Whereby a vertical etching shape is obtainable without associating occurrence of any through-going portions at the gate dielectric film (FIG. 5).

It should be noted here that the language "after elapse of a predetermined time from the startup of the first, overetching process" is to be understood to mean a time period that a ratio of an overetching time during the first overetching step to an overetching time during the second overetching step becomes approximately ⅓ or less. Practically, it means time elapse of about 20 seconds or less in the event that the overetching time at the second overetching step is one minute, about 30 seconds or below in case the overetching time at the second overetching step is one minute and thirty seconds, and about 40 seconds or less in case the overetching time at the second overetching step is two minutes. In this way, subdividing the overetching process aimed at removal of etching residues which are incapable of being completely removed away by the main etching process into the first overetching step of relatively strong overetching condition with adjustment of the amount of an additive gas such as $O_2$ for suppression of an effect of an etching gas to cut the gate electrode material and the second overetching step of relatively weak overetching condition makes it possible to realize the semiconductor device manufacturing method capable of obtaining a gate electrode that does not have any taper-like cross-sectional shape without damaging the gate dielectric film existing as an undercoat layer.

A manufacturing method of a gate electrode with a gate length of 0.12 μm in a semiconductor device with its TEOS oxide film thickness of 50 nm and Poly-Si gate electrode thickness of 200 nm plus gate dielectric film thickness of 2 nm, employing above-mentioned semiconductor device manufacturing method, is described. Suppose here that ECR-RIE apparatus (prototype equipment for 8-inch wafers, chamber internal diameter=350 mm, pump's gas evacuation rate=2000 l/min) is used while letting both a temperature of a stage for installation of the semiconductor device (−5° C.) and a current value of a coil for magnetic field creation be kept constant at each process step.

Firstly, within an atmosphere of a mixture of $Cl_2$ (45 sccm), HBr (100 sccm) and $O_2$ (7 sccm), etching was done as the main etching process with respect to the above-mentioned semiconductor device until exposure of part of a gate dielectric film under the conditions of gas pressure=3 mTorr (about 0.4 Pa), microwave power=500 W, and RF bias power=40 W at an etching rate of Poly-Si etching rate=150 nm/min.

Next, within a mixture atmosphere ($O_2$ addition amount= 2.9 wt %) of HBr (100 sccm) and $O_2$ (3 sccm), etching was done as the first overetching process for 15 seconds under the conditions of gas pressure=3 mTorr, microwave power= 500 W, and RF bias power=40 W (Poly-Si etching rate=120 nm/min).

Thereafter, while increasing an $O_2$ flow rate to be greater than that at the first overetching step, etching was done as the second overetching process for 60 seconds within a mixture atmosphere ($O_2$ addition amount=9 wt %) of HBr (100 sccm) and $O_2$ (10 sccm), under the conditions of gas pressure=3 mTorr, microwave power=500 W and RF bias power=40 W (Poly-Si etching rate=125 nm/min).

From the result of these etching treatment, it was possible to perform etching of the gate electrode without associating creation of any through-going at its associated gate dielectric film (thickness:2 nm), which makes it possible to reduce the one with a CD shift (the value of an etching finish size subtracted by TEOS mask size) of ≦20 nm to the extent that the CD shift is ≦3 nm (in brief, a vertical etching shape was obtained). In addition, these etching treatment enabled the semiconductor device to improve in performance and/or productivity.

It is to be noted that although in the above-mentioned example, the changeover or switching from the main etching to the first overetching was done at a time point that part of the gate dielectric film is exposed, similar results are also obtainable in cases where such switching is done prior to exposure of the gate dielectric film—for example, at about ≦30 nm of the gate electrode residual thickness. Also note that detection of this etching termination point can be carried out by end point detection methods such as plasma luminance monitor, a laser end point or the like.

Further, the semiconductor device's mask material should not be limited only to the above-mentioned TEOS oxide film and employable are either SiN or photoresist; in addition, the object of main etching may also be a gate electrode formed of an amorphous silicon film, a doped polysilicon film with an impurity implanted thereinto, a polycide structure (WSi/ Poly-Si) or a polymetal structure (W/WN/Poly-Si); furthermore, not only the gate electrode but also any wiring leads having these film structures may be employed.

The etching apparatus as used in the present invention should not be limited only to the above-mentioned ECR-RIE apparatus and may alternatively be replaced with any other etching apparatuses of the type using plasma generation schemes—even in the latter case, similar results are obtainable.

Additionally similar results are also obtainable in case the gases for use during the overetching processes contain therein at least HBr and $O_2$ with an inactive gas such as rare gas (He, Ar) and/or $O_2$ being added to these gases.

Next, examination results will be described as to the reason why the gate electrode having a vertical sectional shape is obtainable by use of the semiconductor device manufacturing method in accordance with the present invention.

Figure 6:
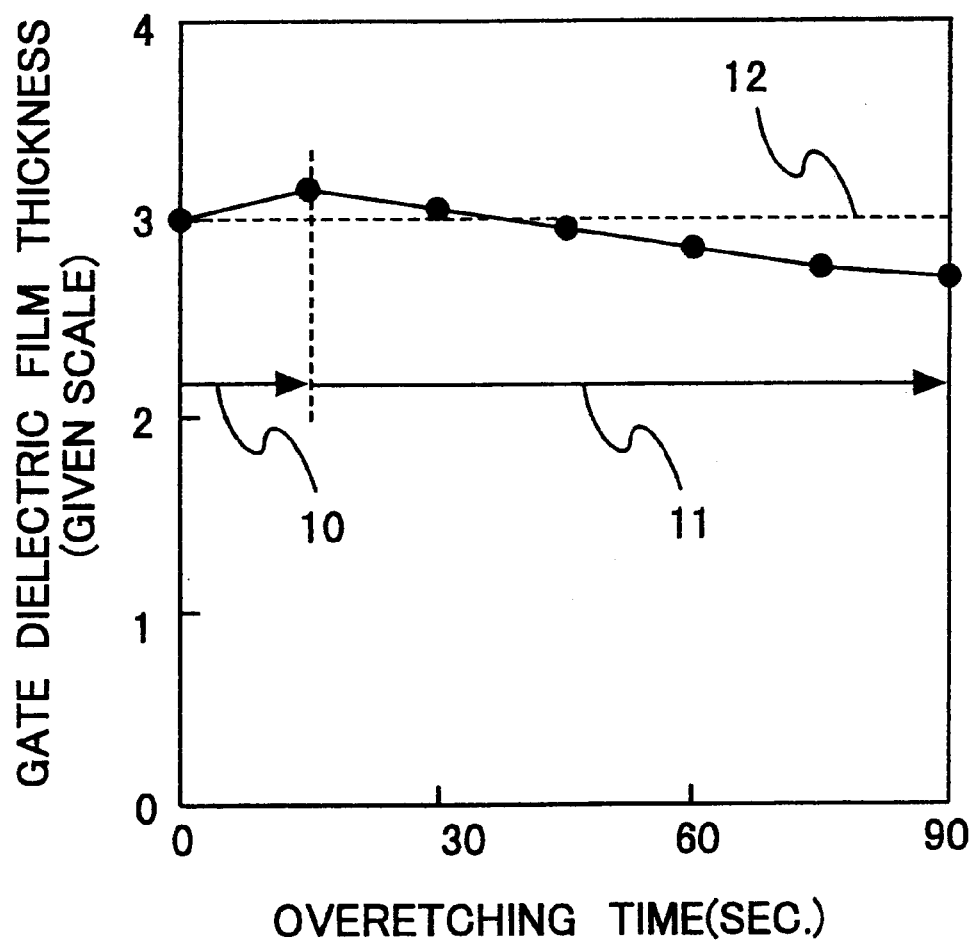
FIG. 6 is a diagram showing an overetching time dependency of gate dielectric film thickness in the semiconductor device used in the present invention.

FIG. 6 shows a change in gate dielectric film thickness after startup of the overetching in the semiconductor device manufacturing method in accordance with the present invention. In FIG. 6, numeral 10 designates a first overetching step less in the amount of deposition matter, 11 denotes a second overetching step for performing high-selectivity etching, 12 indicates an initial film thickness, respectively. Note that the etching conditions used here are the same as those of FIG. 1. As readily understandable from FIG. 6, in spite of the fact that the etching gets started, the film thickness of gate dielectric film increases at the beginning of the overetching.

The inventors of this invention have studied the above phenomenon from various points of view and then have come to estimate that such increase in film thickness of the gate dielectric film takes place due to release or radiation of deposited material (deposition matter), being attached to a chamber wall, from the chamber wall under influence of gas exchange and temperature change or plasma or the like and then coming-flying or inbound onto the semiconductor device.

Figure 7:
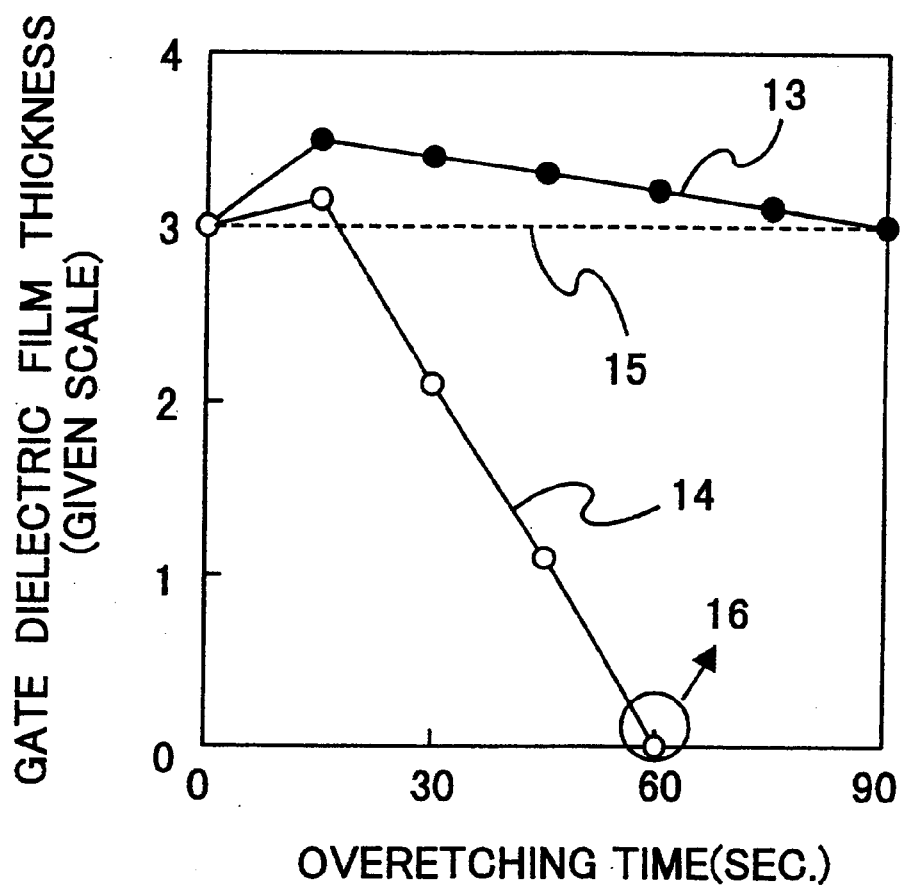
FIG. 7 is a diagram showing a relationship of overetching time dependency of gate dielectric film thickness versus oxygen concentration in the semiconductor device used in the present invention.
Figure 13:
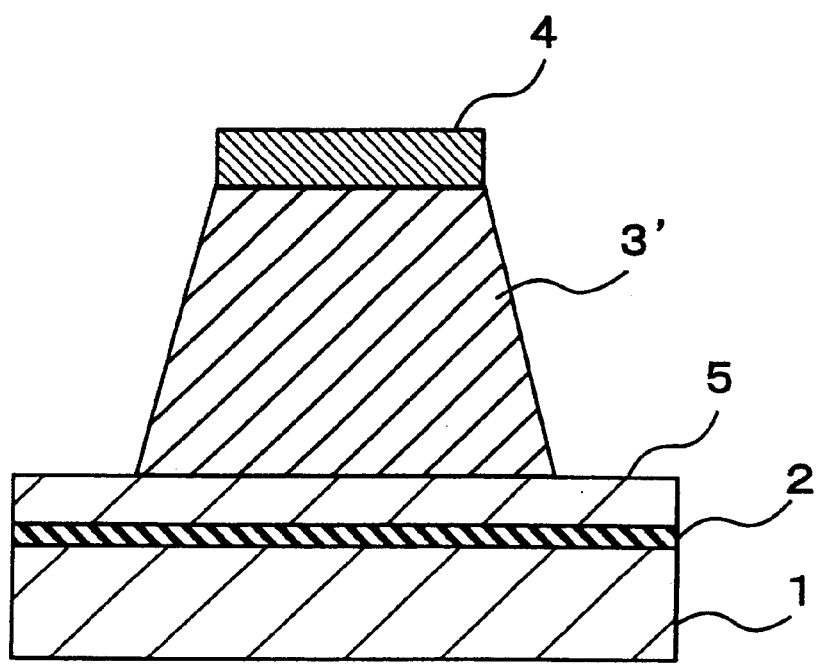
FIG. 13 is a cross-sectional view showing the structure after main etching of the semiconductor device used in the conventional semiconductor device manufacturing method.

FIG. 7 is a result of measurement of a change with time of a residual film thickness of the gate dielectric film in the event that overetching is applied to the semiconductor device as used in the present invention under the traditional condition of high $O_2$ concentration ($O_2$ concentration:≦20%, here, set at 9%) and a condition of low $O_2$ concentration ($O_2$ concentration:≦5%, here set at 2.9%). In FIGS. 7, 13 designates the case of traditional condition of high $O_2$ concentration (for high selection etching), 14 denotes the case of low $O_2$ concentration condition (for low selection etching), 15 indicates an initial film thickness, 16 shows a point at which through-going of the gate dielectric film occurs, respectively. Note here that the kind of the gas used here is the same as the case of FIG. 1. As readily understandable from FIG. 7, the gate oxide film hardly be etched in a gas composition of high $O_2$ concentration as has been used in the conventional manufacturing method of semiconductor device; on the other hand, in a gas composition less in $O_2$ addition amount, the gate dielectric film can be etched, finally resulting in occurrence of through-going or penetration.

Figure 8:
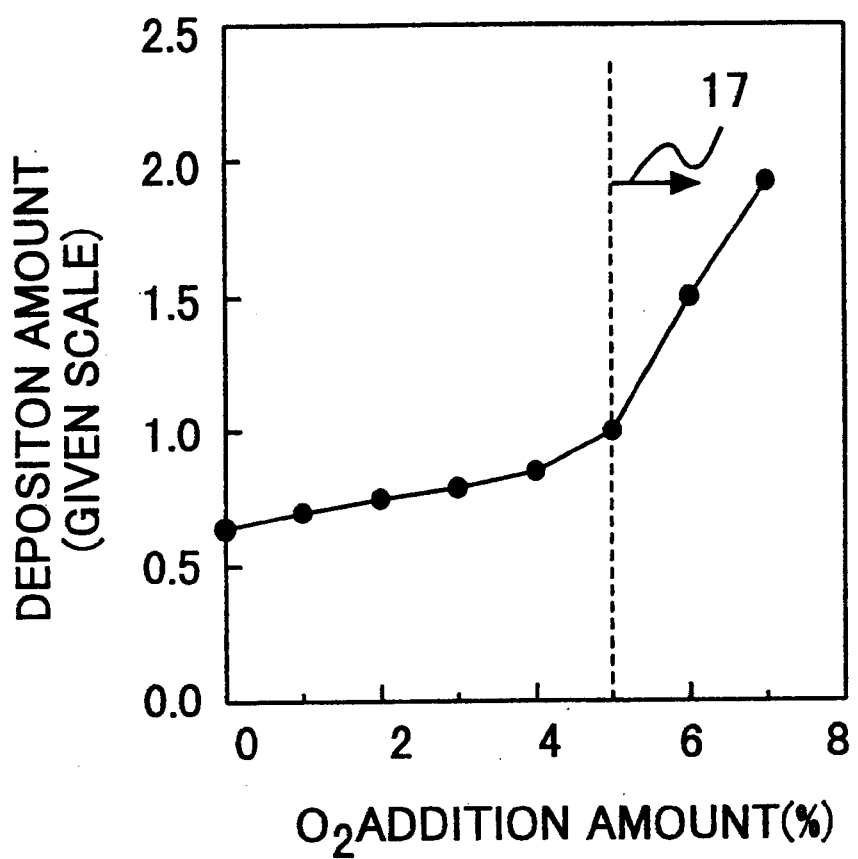
FIG. 8 is a diagram showing an oxygen addition amount dependency of a deposition amount of deposition matter in the semiconductor device used in the present invention.

In addition, FIG. 8 shows oxygen concentration dependency of the amount of deposition matter ($SiBr_xO_y$) being deposited on a wafer after elapse of 5 seconds after startup of overetching in the semiconductor device manufacturing method in accordance with the present invention. In FIG. 8, 17 denotes a region in which deposition matter generates. Note here that the kind of the gas used here is the same as the case of FIG. 1. As shown in FIG. 8, the amount of deposition matter being deposited on the wafer after elapse of 5 seconds since startup of the overetching behaves to increase with an increase in $O_2$ concentration. It must be noted that although the effect for suppression of the deposition amount of deposition matter to be obtained in the semiconductor device manufacturing method in accordance with the present invention is obtained in cases where the $O_2$ addition amount at the second overetching process step is greater than the $O_2$ addition amount at the first overetching step, it would be seen that it is preferable that the $O_2$ addition amount during the first overetching be less than or equal to 5%—more preferably, 3% or less.

Also note that in the case of etching a gate electrode overlying a thin gate oxide film, a decrease in $O_2$ addition amount of the first overetching would result in a likewise decrease in selective effect of the etching (this means that gate electrode material alone is etched while letting the gate dielectric film be prevented from being etched), which leads to occurrence of through-going in the gate oxide film. In this case, it is possible to reduce the attachment amount of deposition matter without having to reduce the selective effect of the etching process, by reducing RF bias power being applied to the etching apparatus at the first overetching step as compared to RF bias power to be applied at the second overetching step.

Figure 9:
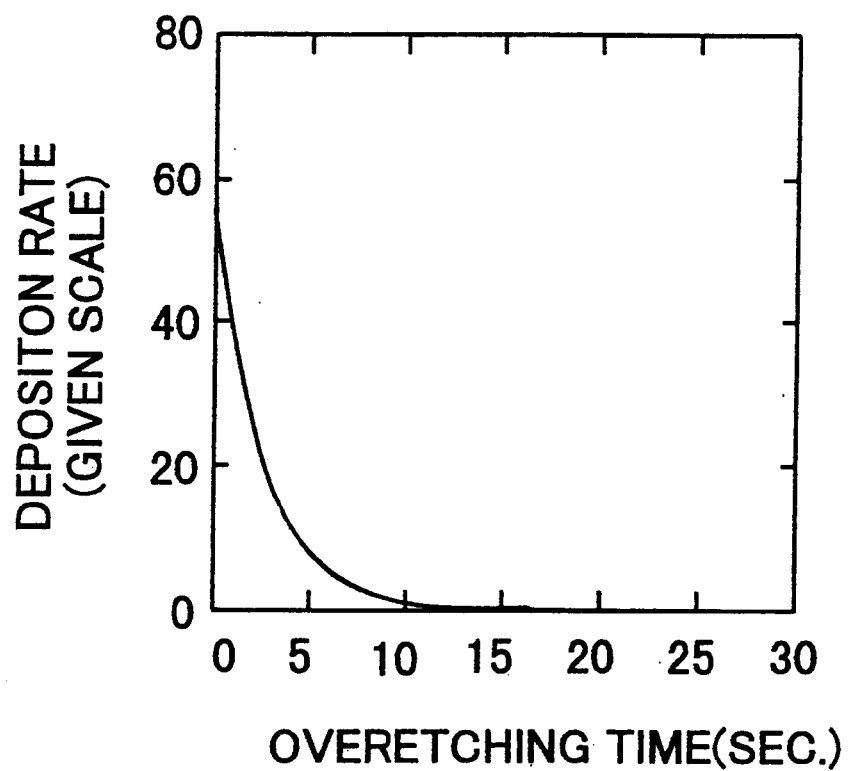
FIG. 9 is a diagram showing an overetching time dependency of deposition rate of deposition matter in the semiconductor device used in the present invention.

FIG. 9 shows an overetching time dependency of a deposition rate of deposition matter in the semiconductor device manufacturing method in accordance with the present invention. A composition of gas used is the same as the case of FIG. 1. As shown in FIG. 9, the deposition rate of the deposition matter being supplied onto a wafer rapidly decreases with an increase in overetching time. From this, it can be readily seen that the deposition matter being supplied onto the wafer during overetching significantly decreases within a time period of between 5 seconds~10 seconds after overetching startup and then completely disappears with elapse of 15 seconds~30 seconds.

Figure 14:
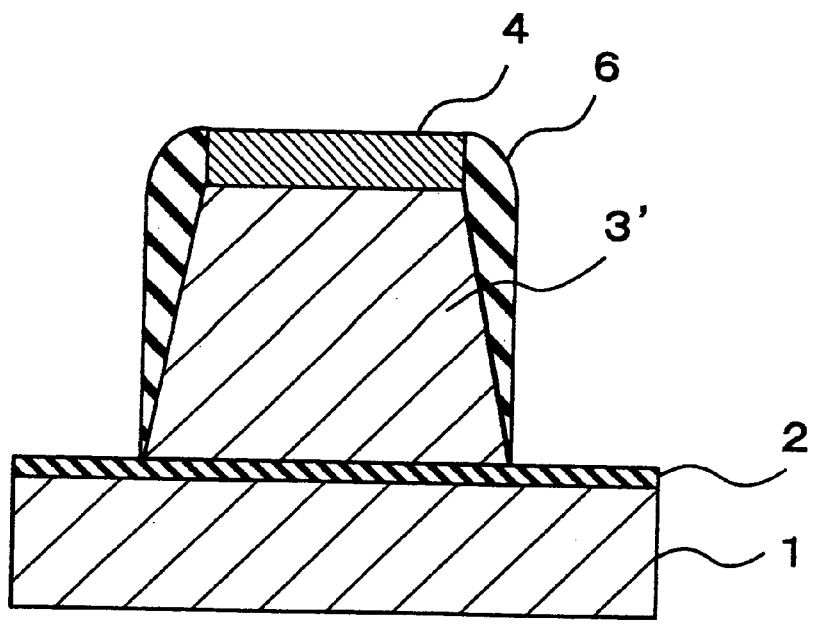
FIG. 14 is a cross-sectional view showing the structure after overetching of the semiconductor device used in the conventional semiconductor device manufacturing method.
Figure 15:
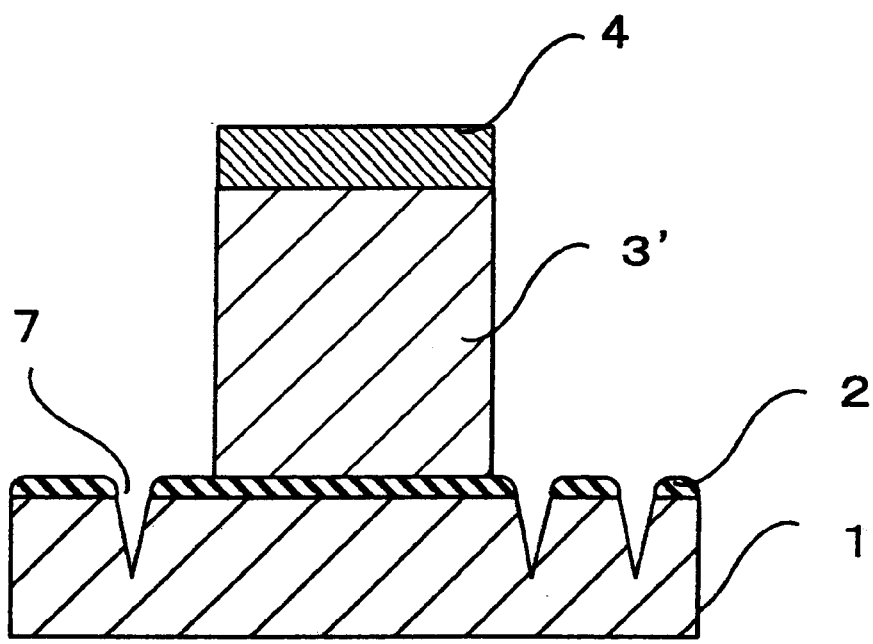
FIG. 15 is a cross-sectional view showing the structure for explanation of through-going of a gate dielectric film of the semiconductor device used in the conventional semiconductor device manufacturing method.

And further, although the use of the semiconductor device manufacturing method in accordance with the present invention enables suppression of formation of a cross-sectional taper shape on sidewalls of a gate electrode, this can be considered in a way which follows. To be brief, in a conventional semiconductor device manufacturing method, it is very likely that an inbound deposition matter attempts to cover taper portions on lateral faces or sidewalls of a gate electrode that exist after main etching as shown in FIG. 14. Due to this, its following overetching to be done thereafter is suppressed by this deposition matter, causing any portion having taper shapes at gate electrode terminate end portions to be left non-etched. Due to this, if the semiconductor device is cleaned after termination of the overetching process then the deposition matter existing at such taper portions will be removed away, resulting in appearance of a gate electrode having a taper shape. However, the semiconductor device manufacturing method of the present invention, the deposition amount of the deposition matter which attempts to cover taper portions on lateral faces or sidewalls of a gate electrode can be reduce and a gate electrode having vertical etching shape can be obtained.

Figure 10:
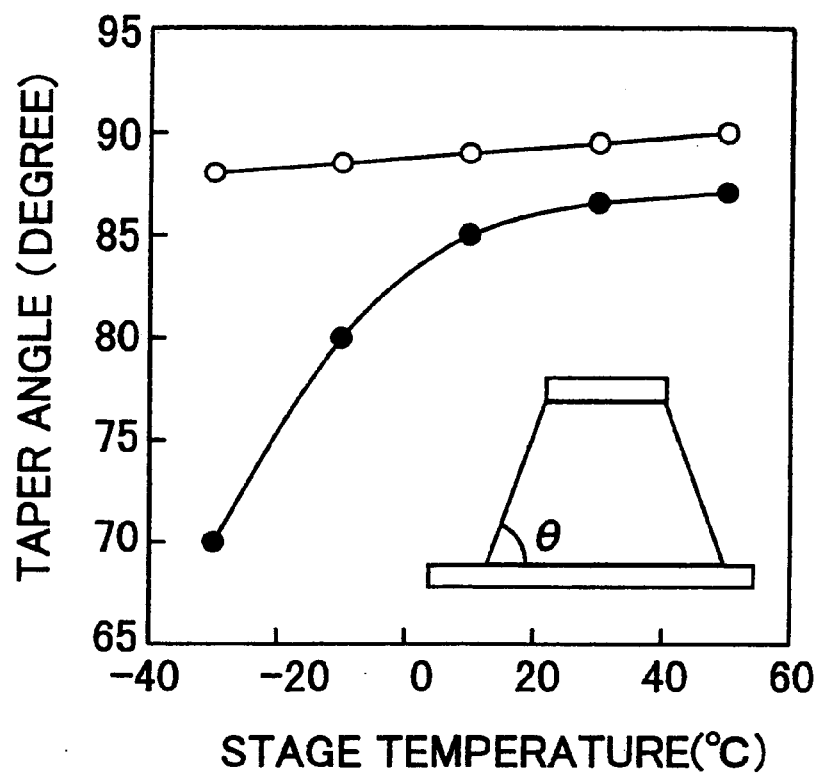
FIG. 10 is a diagram showing stage temperature dependency of taper angle of a gate electrode end portion in the semiconductor device used in the present invention.
Figure 11:
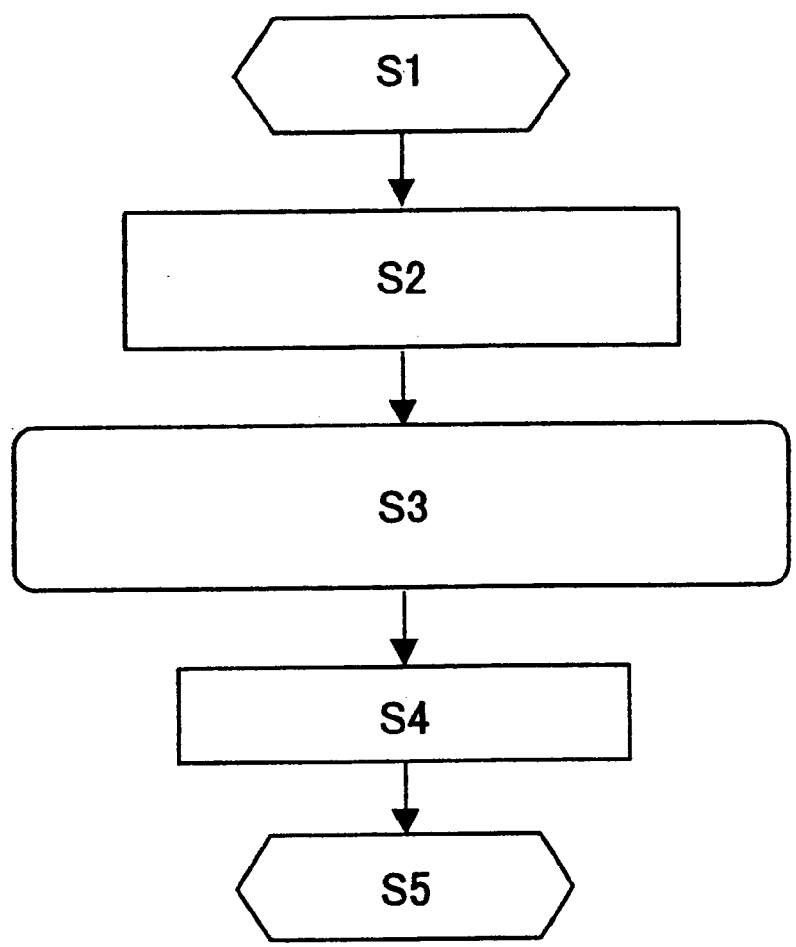
FIG. 11 is a flow diagram showing the conventional semiconductor device manufacturing method.
Figure 12:
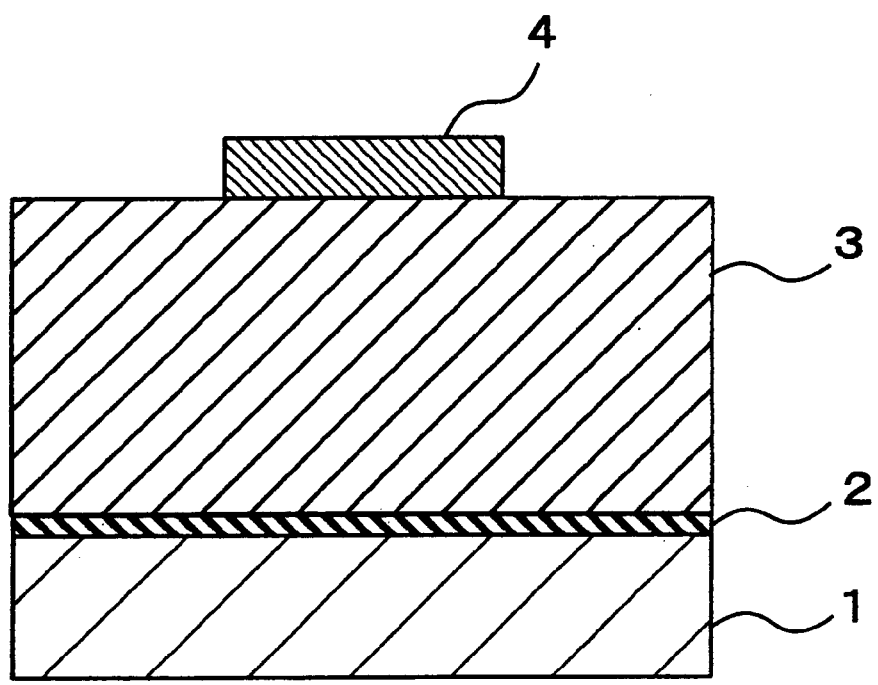
FIG. 12 is a cross-sectional view showing the structure prior to gate etching of a semiconductor device for use with the conventional semiconductor device manufacturing method.

An explanation will next be given of a result of studying as to the stage temperature dependency of a taper angle of the etching shape. In FIG. 10, marks "o" show a relationship relative to a taper shape of gate electrode end portions obtained as a result of a change in temperature of a stage for holding the semiconductor device in the semiconductor device manufacturing method in accordance with the present invention as has been explained in FIG. 1. Additionally, in FIG. 10, marks "●" show a diagram of measurement of a taper shape of gate electrode end portions while changing a temperature of the semiconductor device-holding stage in the conventional semiconductor device manufacturing method (1-step overetching) for comparison purposes.

The semiconductor device to be manufactured by the conventional semiconductor device manufacturing method has been such that it has a large taper shape (small in taper angle) due to attachment of a great amount of deposition matter in cases where the temperature of the stage for mounting a wafer thereon stays less than or equal to 0° C. However, it has been affirmed that owing to the present invention, it is possible to obtain an anisotropic etching shape even where the stage temperature is less than or equal to 0° C.

Although, from FIGS. 7 and 9 set forth previously, the overetching time period at this first overetching process step is designed to fall within a range of from 5 seconds to 30 seconds—preferably, range from about 15 seconds to 30 seconds. The overetching time period at this first overetching process step can vary in optimal value depending upon capacity of a chamber, chamber member, or RF bias power applied or the like, if numerical conversion or "translation" is done to a ratio of a time of overetching at the first overetching step and a time of overetching at the second overetching step, it may be considered that it is roughly not greater than ¼ to ⅓, that is, a time of approximately ⅕ to ¼ of an entire overetching time.

Additionally, regarding the $O_2$ addition amount at the first overetching step, effectiveness is found in cases where it is 5% or below from FIG. 8; more preferably, 3 to 4%.

As has been discussed above, the inventors of the present invention have found out based on the discovery of the phenomenon stated supra that implementation of overetching for more than a time that permits absence of supplement of any deposition matter under a relatively strong overetching condition less in $O_2$ addition amount as the first overetching process step which follows the main etching process for etching more than one electrode and/or wiring lead material and thereafter switching to the second overetching step under a relatively weak overetching condition of great $O_2$ addition amount makes it possible to realize selective etching of the electrode and/or wiring material in the absence of any through-going of gate dielectric film while at the same time obtaining an anisotropic etching shape, and thus have reached the present invention as disclosed and claimed herein.

As described in detail hereinabove with reference to its preferred embodiments, the method for manufacturing a semiconductor device of the invention includes a main etching step of applying etching treatment to an electrode or wiring material being formed on or above a dielectric film as provided at a semiconductor substrate surface to thereby expose the dielectric film, a first overetching step of etching away, after the main etching step, etching residues of the electrode or the wiring material having failed to be etched during etching treatment of the main etching step by etching utilizing a first mixture gas comprising a halogen gas and an additive gas having an effect for suppression of etching of the dielectric film by the halogen gas, and a second overetching step of etching away, after the first overetching step, the etching residues by etching utilizing a second mixture gas comprising the halogen gas and the additive gas and having the additive gas amount of a ratio greater than the first mixture gas. An electrode or alternatively wiring material having a vertical terminate end face shape, without giving damages to a dielectric film while at the same time reducing influence of any deposition matter that comes flying from chamber walls or the like at the initial stage of the overetching process, can be obtained.

The method for manufacturing a semiconductor device of the invention, in case a gas selected from the group consisting of $O_2$, $N_2$, and a combination thereof is used as an additive gas, the effect for suppression of etching of a dielectric film due to halogen gases is significant, which makes it possible to readily perform adjustment of the selectivity, thus enabling specified selectivity to be readily obtained. Additionally in case $O_2$ with an addition amount of 5% or below is used as the additive gas at the first mixture gas, it is possible to suppress inbound of deposition matter from the wall—thus, preferable.

In the method for manufacturing a semiconductor device of the invention, in case a gas selected from the group consisting of HBr, $Cl_2$, HCl, HI and combinations thereof is used as the halogen gas, since it has etching effects with respect to electrodes and wiring materials made of a variety of kinds of substance including but not limited to metals and Si-based ones, the application range is wide—thus, preferable. Also note that in the event that the electrodes or wiring materials contain Si therein, relatively stable and high etching rates can be obtained and thus preferable.

The method for manufacturing a semiconductor device of the invention, in case where the etching treatment at the main etching step is done by utilization of a third mixture gas of HBr/$O_2$/Cl based gas, both the main etching step and the overetching step become processes using HBr/$O_2$ based gas—thus, preferable.

The method for manufacturing a semiconductor device of the invention, in case the time of overetching at the first overetching step is less than or equal to ⅓ of the time of overetching at the second overetching step, it is possible to make sure that the effect of etching any electrodes or wiring materials which have been failed to be etched at the main etching step is obtained without damaging any dielectric films while at the same time suppressing or minimizing the influence of deposition matter that comes flying from chamber walls to fall onto a substrate—thus, preferable.

Additionally the method for manufacturing a semiconductor device of the invention makes it possible to obtain a vertical terminate end face shape even where a semiconductor substrate is held at 0° C. or less at the main etching step, first overetching step and second overetching step—thus, preferable.

What is claimed is:

1. A method of manufacturing a semiconductor device comprising, sequentially:

in a first etching, etching an electrode or wiring material supported by a dielectric film on a semiconductor substrate surface to expose the dielectric film;

in a second etching, after at least part of the dielectric film is exposed, etching and removing etching residues of the electrode or wiring material not removed in the first etching, by etching with a first gas mixture comprising a halogen-containing gas and an additive gas suppressing etching of the dielectric film by the halogen-containing gas; and in a third etching, etching and removing etching residues remaining after the second etching by etching with a second gas mixture comprising the halogen-containing gas and the additive gas and having a larger additive gas to halogen-containing gas ratio than the first gas mixture.

2. The method of manufacturing a semiconductor device of claim 1, wherein the additive gas is a gas selected from the group consisting of $O_2$, $N_2$, and combinations thereof.

3. The method of manufacturing a semiconductor device of claim 1, wherein the additive gas in the first gas mixture is $O_2$, in a concentration not exceeding 5%.

4. The method manufacturing a semiconductor device of claim 1, wherein the halogen-containing gas is selected from the group consisting of HBr, $Cl_2$, HCl, HI, and combinations thereof.

5. The method of manufacturing a semiconductor device of claim 1, wherein the electrode or wiring material contains Si.

6. The method of manufacturing a semiconductor device of claim 1, including etching the electrode or wiring material with a gas mixture of HBr, $O_2$, and Cl.

7. The method of manufacturing a semiconductor device of claim 1, including etching with the first gas mixture for a time period no longer than 1/3 of the time of etching with the second gas mixture.

8. The method of manufacturing a semiconductor device of claim 1, wherein the semiconductor substrate is held at a temperatures no higher than 0° C. in each etching.

* * * * *